(12) United States Patent
Fabiano et al.

(10) Patent No.: US 9,318,596 B2
(45) Date of Patent: Apr. 19, 2016

(54) FERROELECTRIC FIELD-EFFECT TRANSISTOR

(71) Applicant: Acreo Swedish ICT AB, Kista (SE)

(72) Inventors: Simone Fabiano, Norrkoping (SE); Xavier Crispin, Kimstad (SE); Magnus Berggren, Vreta Kloster (SE)

(73) Assignee: ACREO SWEDISH ICT AB, Kista (SE)

( * ) Notice: Subject to any disclaimer, the term of this patent is extended or adjusted under 35 U.S.C. 154(b) by 72 days.

(21) Appl. No.: 14/205,481

(22) Filed: Mar. 12, 2014

(65) Prior Publication Data

US 2014/0264515 A1    Sep. 18, 2014

Related U.S. Application Data

(60) Provisional application No. 61/788,049, filed on Mar. 15, 2013.

(30) Foreign Application Priority Data

Mar. 15, 2013   (EP) ..................................... 13159493

(51) Int. Cl.

| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 21/00 | (2006.01) |
| H01L 29/78 | (2006.01) |
| H01L 51/05 | (2006.01) |

(Continued)

(52) U.S. Cl.
CPC .......... *H01L 29/78* (2013.01); *H01L 29/66477* (2013.01); *H01L 51/052* (2013.01); *H01L 51/0529* (2013.01); *H01L 51/0003* (2013.01)

(58) Field of Classification Search
CPC .......................... H01L 29/78; H01L 29/66477
USPC ............................................... 257/295; 438/3
See application file for complete search history.

(56) References Cited

U.S. PATENT DOCUMENTS

| | | | |
|---|---|---|---|
| 2004/0113186 A1* | 6/2004 | Karasawa et al. ............. | 257/295 |
| 2005/0054166 A1* | 3/2005 | Hsu et al. ...................... | 438/287 |

(Continued)

FOREIGN PATENT DOCUMENTS

EP            2022816 A2     2/2009

OTHER PUBLICATIONS

Kang, S. et al., "Spin case ferroelectric beta poly(vinylidene fluoride) thin films via rapid thermal annealing," Applied Physics Letters, vol. 92, No. 1, pp. 12921-12921, Jan. 11, 2008.

(Continued)

*Primary Examiner* — David S Blum
(74) *Attorney, Agent, or Firm* — Harness, Dickey & Pierce, P.L.C.

(57) ABSTRACT

A ferroelectric field-effect transistor device includes: a semiconductor layer; a ferroelectric layer; and an ion conductor layer arranged between the semiconductor layer and the ferroelectric layer and in contact with the semiconductor layer. Methods for producing the ferroelectric field-effect transistor device and using the ferroelectric field-effect transistor device in non-volatile memory devices that reduce a readout voltage to a voltage as low as 0.2 V are also disclosed.

20 Claims, 5 Drawing Sheets

(51) Int. Cl.
  *H01L 29/66* (2006.01)
  *H01L 51/00* (2006.01)

(56) References Cited

U.S. PATENT DOCUMENTS

2005/0151210 A1* 7/2005 Li et al. ............ 257/410
2005/0249975 A1 11/2005 Sandberg et al.
2009/0035565 A1 2/2009 Serbutoviez et al.

OTHER PUBLICATIONS

Herlogsson, L. et al., "Polyelectrolyte-Gated Organic Complementary Circuits Operating at Low Power and Votage," Advanced Materials, vol. 23, No. 40, pp. 4684-4689, Oct. 25, 2011.

Scott, J. et al., "Nonvolatile Memory Elements Based on Organic Materials," Advanced Materials, pp. 1452-1463, 2007.

Extended European Search Report mailed Jun. 4, 2013.

* cited by examiner

FERROELECTRIC FIELD-EFFECT TRANSISTOR

PRIORITY STATEMENT

The present application hereby claims priority under 35 U.S.C. §119 to European patent application number EP 13159493.9, filed Mar. 15, 2013 and U.S. Provisional Application No. 61/788,049, filed Mar. 15, 2013, the entire contents of which are hereby incorporated herein by reference.

TECHNICAL FIELD

The invention relates generally to ferroelectric field-effect transistors and more specifically to organic ferroelectric field-effect transistors.

BACKGROUND ART

Memory functionality is a prerequisite for many electronic applications in modern society. In fact, most envisioned electronic applications require non-volatile memory systems that can be programmed, erased and read-out electrically. One of the strongest trends in modern technology today is to embed and integrate printed electronic systems of various kinds into various low-cost items, such as packages, tags and stickers, for applications in distributed diagnostics, track-and-trace, safety and much more. Organic non-volatile memory devices based on ferroelectricity represent a promising approach towards the development of a low-cost technology that is possible to manufacture using common printing technologies (Scott et al., "Nonvolatile memory elements based on organic materials", Advanced Materials 19, 1452-1463 (2007)).

Transistors are extensively used in conventional semiconductor memories. Organic ferroelectric field-effect transistors are ideally suited for the achievement of low-cost, high-performance non-volatile memory technology, as they allow for long data retention time and non-destructive read-out voltage typically of around 2-4 V. The latter arises from the high charge carrier concentration induced in the semiconductor by the ferroelectric polarization of the gate insulator, which provides resistive switching between a high (on-state) or low (off-state) drain current level. The read-out operation requires a source-drain bias that is of the same order of magnitude as that of the writing voltage that is achieved by addressing the gate. This means that the read-out operation can potentially disturb the polarization of these ferroelectric field-effect transistor cells.

Therefore, there is a desire to develop a ferroelectric gate insulator material system that provides high charge carrier concentrations in the organic semiconductor already at drain-source voltages far below the voltage needed to switch the ferroelectric field-effect transistor cell via the gate.

SUMMARY OF THE INVENTION

It is an object of the present disclosure to provide an improved ferroelectric field-effect transistor device. Another object of the present disclosure is to provide a ferroelectric field-effect transistor useful in non-volatile memory systems. A further object of the present disclosure is to provide a ferroelectric gate insulator material system that provides high charge carrier concentrations in the organic semiconductor. Yet a further object of the present disclosure is to provide a ferroelectric field-effect transistor which when used in a non-volatile memory system allows for read-out operation at lower read-out voltage.

These objects, as well as other objects that will be apparent to the skilled person in the light of the present disclosure, are achieved by a device in accordance with the appended independent claims. Preferred embodiments are defined in the dependent claims.

Recently, various electrolytes have been explored as the gate insulator of organic field-effect transistors resulting in devices having low gate operating voltages (under 1 V). These devices rely on the polarization of the electrolyte gate insulator, which is accompanied by a drift of ions towards the gate/electrolyte and electrolyte/semiconductor interfaces. This polarization establishes two electric double layers across which the entire electric potential generated by the gate-source bias voltage drops. The electric double layers generate high transversal electric fields ($10^9$ Vm$^{-1}$) already at very low gate-source voltages, which enables low operating voltages, typically less than 1 V.

The present inventors have unexpectedly found that the introduction of an ion conductor layer between the semiconductor layer and the ferroelectric layer of a ferroelectric field-effect transistor can significantly improve the properties of the transistor when used in a non-volatile memory system. Surprisingly, using a ferroelectric field-effect transistor device according to the invention non-destructive source-drain read-out voltages as low as 0.2 V can be achieved. This is one order of magnitude lower than read-out voltages achieved and reported with conventional ferroelectric field-effect transistors. The on- and off-state drain currents can differ by several orders of magnitude. Furthermore, it was found that the introduction of an ion conductor layer between the semiconductor layer and the ferroelectric layer of the ferroelectric field-effect transistor did not adversely affect the programming time of the device compared to a similar device without the ion conductor layer.

In addition to the low-voltage non-destructive read-out, the ferroelectric field-effect transistors of the present disclosure also provide for long data retention time, high programming cycle endurance, short programming time, and low-cost manufacturing.

According to a first aspect the invention provides a ferroelectric field-effect transistor device comprising:
a semiconductor layer;
a ferroelectric layer; and characterized by
an ion conductor layer arranged between said semiconductor layer and said ferroelectric layer and in contact with the semiconductor layer.

According to an embodiment, the ferroelectric field-effect transistor device further comprises:
a source electrode arranged in electronic contact with the said semiconductor;
a drain electrode arranged in electronic contact with the said semiconductor; and
a gate electrode;
said ferroelectric layer being arranged between said gate electrode and said ion conductor layer.

The ferroelectric field-effect transistor device is further advantageous in that it can be realized from organic materials. Particularly at least one of the layers of the device may be organic, i.e. the semiconductor layer, the ferroelectric layer and the ion conductor layer.

According to an embodiment, the semiconductor, the ferroelectric and/or the ion conductor comprise organic materials. According to a preferred embodiment, the semiconductor, the ferroelectric and the ion conductor all comprise organic materials.

One advantage of using organic materials in the ferroelectric field-effect transistor device is that it may allow of manufacturing flexible electronic devices.

A further advantage of using organic materials in the device is that such organic materials are generally suitable for being applied to a substrate using liquid deposition techniques. Preferably, at least one of the semiconductor, the ferroelectric and/or the ion conductor may be applied by liquid deposition techniques.

According to an embodiment, the semiconductor, the ferroelectric and/or the ion conductor can be applied by liquid deposition techniques. According to a preferred embodiment, the semiconductor, the ferroelectric and the ion conductor can all be applied by liquid deposition techniques.

One group of compounds useful in the different layers is polymers. According to an embodiment, the semiconductor, the ferroelectric and the ion conductor all comprise polymers.

According to an embodiment, the semiconductor is selected from the group consisting of semiconducting polymers.

According to an embodiment, the ferroelectric is selected from the group consisting of ferroelectric polymers.

According to an embodiment, the ion conductor is selected from the group consisting of polymeric electrolytes.

When the organic semiconductor is of the p-type, the polymeric electrolyte is preferably selected from the group of polyanions and polymeric anions.

When the organic semiconductor is of the n-type, the polymeric electrolyte is preferably selected from the group of polycations and polymeric cations.

The transport of electrons and holes, the so-called ambipolar charge transport, in field-effect transistors is a highly desirable property. The use of ambipolar materials enables the fabrication of complementary-like circuits through the use of a single semiconductor that functions both as p- and/or as n-channel, hence significantly reducing fabrication complexity. Furthermore, the advantages compared with unipolar logic are low power dissipation, higher operating frequencies, a good noise margin, and robust operation. Thus, according to an embodiment, the semiconductor is an ambipolar-type semiconductor.

According to an embodiment, the ferroelectric field-effect transistor device further comprises a polymeric interlayer, said interlayer being arranged between said gate electrode and said ferroelectric layer. The polymer of the polymeric interlayer, which may for example comprise a polyelectrolyte, protects the thin ferroelectric layer from damage when the gate electrode is applied and may also provide improved adhesion between the ferroelectric layer and the gate electrode. Also, when a polyelectrolyte is used, the higher hydrophilicity of the polyelectrolyte interlayer facilitates deposition of polymeric gate electrodes by ink-jet printing tecnique. A polymeric interlayer can also prevent diffusion of metal from a metal gate electrode into the ferroelectric layer, thereby reducing the leakage current.

According to an embodiment, the ferroelectric field-effect transistor device is arranged on a suitable substrate. According to a preferred embodiment, the ferroelectric field-effect transistor device is arranged on a flexible solid substrate, e.g. a flexible plastic substrate.

According to a second aspect the invention provides a non-volatile memory device comprising a ferroelectric field-effect transistor device according to the first aspect.

Using a ferroelectric field-effect transistor device according to the invention non-destructive source-drain read-out voltages as low as 0.2 V can be achieved. This is one order of magnitude lower than read-out voltages achieved and reported with conventional ferroelectric field-effect transistors. The on- and off-state drain currents can differ by several orders of magnitude.

In addition to the low-voltage non-destructive read-out, the ferroelectric field-effect transistors of the present disclosure also provide for long data retention time, high programming cycle endurance, short programming time, and low-cost manufacturing.

The ferroelectric field-effect transistors of the present disclosure also allows for simple and low-cost manufacturing. For example, non-volatile memory arrays comprising simple cross-bar architectures obtainable by solution based manufacturing processes. Since all the functional materials for fabricating ferroelectric field-effect transistors can be solution based, it is feasible to implement the transistors on a flexible substrate by printing or other liquid deposition techniques.

According to a third aspect the invention provides a method of producing a ferroelectric field-effect transistor device, comprising the steps:

providing a substrate;
applying a semiconductor layer;
applying a ferroelectric layer; and
applying an ion conductor layer;
such that said ion conductor layer is arranged between said semiconductor layer and said ferroelectric layer and in contact with the semiconductor layer.

The ferroelectric field-effect transistor device may be produced in a top gate or bottom gate configuration. Thus, according to an embodiment the device is produced in a top gate configuration. According to this embodiment, the method comprises the steps:

providing a substrate;
applying a source electrode to the substrate;
applying a drain electrode to the substrate;
applying a semiconductor layer in electronic contact with said source and drain electrodes;
applying an ion conductor layer to the semiconductor layer;
applying a ferroelectric layer to the ion conductor layer; and
applying a gate electrode to the ferroelectric layer.

According to an embodiment the device is produced in a bottom gate configuration. According to this embodiment, the method comprises the steps:

providing a substrate;
applying a gate electrode to the substrate;
applying a ferroelectric layer to the gate electrode;
applying an ion conductor layer to the ferroelectric layer;
applying a semiconductor layer to the ion conductor layer;
applying a source electrode in electronic contact with the said semiconductor; and
applying a drain electrode in electronic contact with the said semiconductor.

According to an embodiment, the method further comprises applying a polymeric interlayer between said gate electrode and said ferroelectric layer.

According to an embodiment, the semiconductor layer, the ferroelectric layer and the ion conductor layer are applied by liquid deposition techniques.

According to an embodiment, said substrate is a solid substrate; preferably a flexible solid substrate.

According to a fourth aspect the invention provides use of an ion conductor layer between a ferroelectric layer and a semiconductor layer of a ferroelectric field-effect transistor device to reduce the read-out voltage of a non-volatile memory device comprising said ferroelectric field-effect transistor device.

The above described and other features are exemplified by the following figures and detailed description.

BRIEF DESCRIPTION OF THE DRAWINGS

Referring now to the figures, which are exemplary embodiments, and wherein the like elements are numbered alike.

DETAILED DESCRIPTION OF PREFERRED EMBODIMENTS

Figure 1:
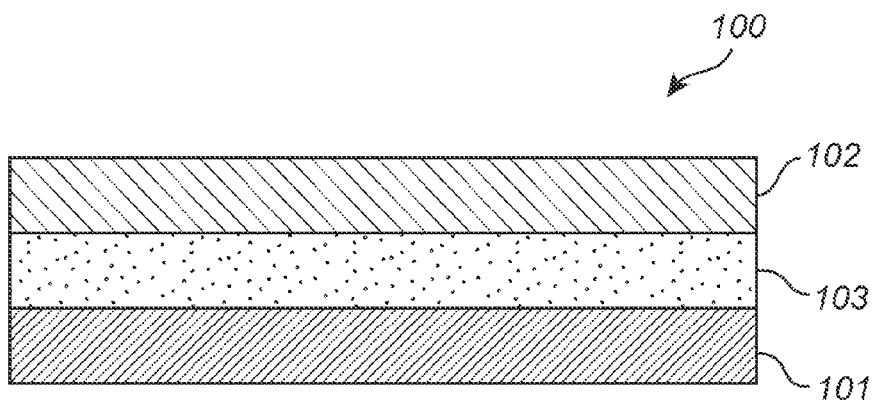
FIG. 1 schematically illustrates a cross-section of a transistor according to the invention.

According to an embodiment schematically illustrated in FIG. 1, the ferroelectric field-effect transistor device 100 comprises a semiconductor layer 101, a ferroelectric layer 102, and an ion conductor layer 103 arranged between said semiconductor layer and said ferroelectric layer and in contact with the semiconductor layer. The device generally further comprises at least three electrodes, specifically a source electrode, a drain electrode and a gate electrode. The source and drain electrodes are arranged in electronic contact with the semiconductor layer and the gate electrode is separated from the semiconductor layer by the ferroelectric layer and ion conductor layer.

According to an embodiment, the transistor channel of the ferroelectric field-effect transistor device is formed of the semiconductor layer located between a source and a drain electrode. The conductivity of the transistor channel is altered or controlled by changing the electric field created at the ion conductor-semiconductor interface. This altered electric field may be achieved by changing the voltage applied to the gate electrode, whereby ferroelectric polarization of the ferroelectric layer is achieved. The polarization of the ferroelectric layer in turn causes the ion in the ion conductor layer to be redistributed. Ions collected at the ion conductor-semiconductor interface attract compensation charges in the semiconductor by means of field-effect, so that an electric double layer is formed at the interface, and the channel opens when enough charge carriers in the semiconductor are accumulated at said interface. The active section of the transistor channel is normally defined by the extension of the electric double layer in the semiconductor, which usually is in the order of a few nanometers. In other words, when a suitable voltage is applied to the gate electrode, ions are redistributed in the ion conductor layer, such that an electric field is created, which alters the polarization of the semiconductor layer.

The ion conductor layer comprises an ion conductor. An ion conductor is a material capable of conducting ions. The ion conductor may for example comprise an electrolyte. An electrolyte is an electrical conductor in which current is carried by ions rather than by free electrons (as in a metal). The ion conductor layer may consist of a single ion conductor material or a mixture of two or more ion conductor materials. Optionally, the ion conductor layer may further comprise non-ion conductor additives, for example a non-ion conductor polymer.

According to one embodiment of the invention said ion conductor is an organic, organometallic or inorganic electrolyte which dissociates partially in ions. The organic electrolyte is preferably a molecular, macromolecular, oligomeric or polymeric electrolyte, selected from a group comprising for example ionic surfactants or ionic detergents, ionic liquids, fatty acids, amino-acid based molecules and polymers (such as proteins), saccharides or polysachamides, biomolecules and macromolecules with phosphate groups (e.g. DNA, phosphoglycerides, phospholipids), oligoions or polyions.

In embodiments where the semiconductor layer comprises an organic, for example polymeric, semiconductor it may be desirable to minimize penetration of charge carriers from the ion conductor layer into the semiconductor layer. One way of minimizing the penetration of charge carriers from the ion conductor into an organic, for example polymeric, semiconductor is to select or arrange the ion conductor such that it dissociates into smaller and substantially larger ion-complexes of opposite charge, and selecting the voltage applied to the gate electrode such that the smaller ion-complexes are attracted to the gate electrode. The large ion-complexes preferably comprise long polymer chains or large molecules. The size of the larger ion-complexes either prevents them from penetrating into the organic semiconductor, and/or renders them substantially immobile, such that they do not migrate to the interface between said ion conductor and said organic semiconductor to any significant extent. This effect is also achieved when the voltage applied to the gate electrode is not sufficiently high to effectuate any substantial displacement of the larger ion-complexes. In other words, the mobility of an ion is a combination of their size and the applied electric field.

Accordingly, when the semiconductor layer comprises a p-type semiconductor, the ion conductor is preferably selected from the group consisting of electrolytes composed of larger anionic molecules and smaller cationic molecules, for example polyanions or polymeric anions with proton or metal counter ions.

Thus, according to an embodiment the ion conductor layer comprises polyanions or polymeric anions. According to one embodiment of the invention said ion conductor layer comprises an acid-functional homopolymer or homooligomer or an acid-functional copolymer or cooligomer. In other words, the electrolyte layer of said field-effect transistor device preferably is a oligomeric or polymeric acid having at least one acid-functional group.

According to one embodiment of the invention said oligomeric or polymeric acid of said electrolyte layer is an oligomer or polymer of monomer units having phosphonic acid, sulphonic acid, carboxylic acid or phosphoric acid groups. Preferably, said monomer units have phosphonic acid groups, and even more preferred said monomer units are vinylphosphonic acid. Moreover, said monomer units advantageously have sulphonic acid groups, and even more preferred, said monomer units are styrene-4-sulphonic acid or a salt thereof, such as PSSNa poly(sodium 4-styrenesulfonate)

According to another embodiment of the invention said oligomeric or polymeric acid is a cooligomer or copolymer of first comonomer units having phosphonic acid, sulphonic acid, carboxylic acid or phosphoric acid groups, and second comonomer units having phosphonic acid, sulphonic acid, carboxylic acid or phosphoric acid groups, the first and second comonomer units being different. Advantageously, said first co-monomer units have phosphonic acid groups, and even more preferred said first comonomer units are vinylphosphonic acid. Moreover, said second comonomer units preferably have carboxylic acid groups, and even more preferred said second comonomer units preferably are acrylic acid. More specifically, said first comonomer units are preferably vinylphosphonic acid and said second comonomer units are preferably acrylic acid, which advantageously is present in the cooligomer or copolymer at a molar ratio of vinylphosphonic acid to acrylic acid of higher than 50:50, preferably higher than 70:30 and even more preferred 85:15.

According to yet another embodiment of the invention said electrolyte is a composition of two or more oligomeric or polymeric acids as defined above. Advantageously, said electrolyte is a composition of a polymer of vinylphosphonic acid and a polymer of acrylic acid, preferably at a molar ratio of vinyl-phosphonic acid to acrylic acid of higher than 70:30. The use of copolymer or cooligomer of vinylphosphonic acid and acrylic acid is advantageous as such substances release a large concentration of protons and have a large proton mobility. Hence, the resulting electrolyte forms the electric double layers faster, which results in a fast response of the transistor.

According to an embodiment illustrated herein the electrolyte layer included in the device comprises an electrolyte selected from polyvinyl alcohol (PVA), poly acrylic acid (PAA), PCPhOH (poly(vinyl phenol), polyvinyl sulphonic acid (PVSH), poly(styrene-4-sulphonic acid (PSSH), polysaccharide, preferably amylase, poly(vinylphosphonic acid-co-acrylic acid (P(VPA-co-AA)), or mixtures thereof. Typically, the polyelectrolyte is poly(vinylphosphonic acid-co-acrylic acid (P(VPA-co-AA)).

Preferably the ion conductor comprises an organic material, more preferably said organic material comprises a polymer. The polymer may preferably be a hydrogel based on a polymer selected from the group consisting of polyacrylates, such as poly(2-hydroxyethyl methacrylate) and poly(acrylamide), polyelectrolytes, such as poly(styrene sulfonic acid) (PSS) and poly(acrylic acid) (PAA), polysaccharides, such as agarose and dextran, gelatin and other watersoluble polymers, such as polyvinyl alcohol, polyvinyl pyrrolidone and polyethylene glycol. The ion-conductive channel may also comprise a polyelectrolyte, such as for example poly(styrene sulfonic acid) (PSS) or poly(acrylic acid).

When the semiconductor layer comprises an n-type semiconductor, the ion conductor is preferably selected from the group consisting of electrolytes composed of larger cationic molecules and smaller anionic molecules, for example as polycations or polymeric cations with smaller negatively charged counter ions.

Thus, according to an embodiment the ion conductor layer comprises polycations or polymeric cations.

According to one embodiment the ion conductor layer comprises polycations containing primary, secondary and/or tertiary amino groups. According to one embodiment the ion conductor layer comprises poly(ethylenimine), poly(1-lysine), diethylaminoethyl-dextran, poly(vinyl pyridinium bromide).

According to one embodiment the ion conductor layer comprises polymers having quaternary ammonium groups, such as polymers bearing imidazolium groups. Examples are polyquaterniums, such as poly(diallyl-dimethyl-ammonium chloride), and copolymers with quaternized vinylimidazole units, such as poly(3-methyl-1-vinylimidazolium-co-vinylpyrrolidone) chloride.

In the ferroelectric field-effect transistor device, the ion conductor layer is preferably arranged such that when an electric field is applied across said layer, charge carriers or ions which are available within said layer, will electro-migrate toward the respective surface or side of the material, in accordance with the applied electric field. For instance, available cations will move toward a negatively biased gate electrode. The anions are normally immobile as they are fixed on the polymer (oligomer) chains (resulting in a polyanion).

In order to allow formation of a fully covering ion conductor layer, e.g. free from pinholes, the electrolyte layer may preferably be at least 10 nm thick. The electrolyte layer could also be made much thicker using e.g. printing techniques. The thickness of the ion conductor layer may typically be in the range of 50-200 nm, such as about 130 nm.

The semiconductor layer of the ferroelectric field-effect transistor device may comprise an organic, organometallic or inorganic semiconducting material. The semiconducting material may be a p-type, n-type or ambipolar semiconductor. The semiconductor layer may consist of a single semiconductor material or a mixture of two or more semiconductor materials. Optionally, the semiconductor layer may further comprise non-semiconductor additives, for example a non-semiconductor polymer.

Inorganic semiconducting materials are well known to the skilled person.

According to an embodiment, the semiconductor of the ferroelectric field-effect transistor device is an organic semiconductor. Organic semiconductors may comprise molecular, macromolecular, oligomeric or polymeric semiconductors.

Advantageously, the organic semiconductor layer comprises organic dyes and pigments, such as aromatic molecules, conjugated molecules, organic photochromics, liquid crystals and/or discotic liquid crystals. Further, said organic semiconductor layer preferably comprises organometallic complexes and polymers, such as derivatives of porphines, phtalocyanine etc, as well as carbon nanotubes and fullerenes derivatives.

According to an embodiment, the semiconductor of the ferroelectric field-effect transistor device is a semiconducting conjugated polymer. Examples of such semiconducting conjugated polymers include, but are not limited to poly(alkylthiophene), poly(thienylene-vinylene), polyfluorene, polydiacetylene, poly(p-phenylene vinylene), or copolymers thereof. Typically, the conjugated polymer may be selected from the group consisting of poly-3-alkylthiophenes, for example, poly3-hexylthiophene (P3HT), poly(thienylene-vinylene), polyfluorene, polydiacetylene, poly(p-phenylene vinylene), or mixtures thereof.

Advantageously, said organic semiconductor layer comprises molecular, oligomeric polymeric or dendrimeric conjugated materials. More preferably said molecular, oligomeric or polymeric conjugated material of said organic semiconducting layer is selected from the group consisting of perylene, naphthalene, anthracene, tetracene, pentacene, hexacene, rubrene, phtalocyanines, porphyrines, and oligomers or polymers of anilines, perylenediimides, naphthalenediimides, dialkylperylenedicarboximides, dialkylnaphthalenedicarboximides, triarylamines, pyrroles, dithienopyrroles, diketopyrrolopyrroles, carbazoles, thiophenes, dithiophenes, cyclopentadithiophenes, dithienothiophenes, benzodithiophenes, dialkoxybenzodithiophenes, benzothienobenzothiophenes, thienylenevinylenes, thiazoles, thiazolothiazoles, benzobisthiazoles, benzobisthiadiazoles, benzobisoxazoles, benzothiadiazoles, quinoxalines, thienoimides, fluorenes, indenofluorenes, indacenodithiophenes, siloles, dithienosiloles, dibenzosiloles, dibenzo(thieno)siloles, pyrazines, thienopyrazines, naphthodithiophenes, phthalimides, quinixalines, dithienylquinoxalines, benzoxadiazoles, acetylenes, sulfur nitrides, diacetylenes, phenylenes, thienylenevinylenes, phenylenevinylenes, cyanovinylenephenylene, phenylene sulfides, thiazines, phenothiazines, benzobisimidazobenzophenanthrolines, dithenodiimides, and derivatives thereof.

According to an embodiment, the semiconductor is a p-type semiconductor. Examples of p-type semiconductors include thiophenes, dithiophenes thienothiophenes, dialkylfluorene-alt-triarylamines, triarylamines, carbazoles, pyrroles, dithienopyrroles, n-alkyldithienopyrrole-thiophenes, alkylbithiophen-bisthienopyrroles, thiazole, fused thiophenes, dithienothiophenes, benzodithiophenes, thienylenevinylenes, thiazolothiazoles, benzobisthiazoles, benzobisoxazoles, benzobisthiazole-thiophenes, isoindigo, fluorenes, indenofluorenes, indacenodithiophenes, siloles, dithienosiloles, thienopyrazines, benzothienobenzothiophenes, naphthodithiophenes, thiophene-cyclopentadienones, phthalimide-bithiophenes, tetrazines, phenylenes, thienylenevinylenes, phenylenevinylenes, bi(phenylenevinylenes), bi(thienylenevinylenes), phenothiazinevinylenes, cyanovinylenephenylenes, cyclopentadithiophenes, dibenzo(thieno)siloles, dialkoxybenzodithiophenes, cyclopentadithiophene-benzothiadiazoles, benzobis(silolothiophenes), diketopyrrolopyrroles, pyrido-pyrazines, benzothiadiazoles, benzoxadiazoles, dithienylquinoxalines, thiadiazolopyridines, and derivatives thereof.

According to an embodiment, the semiconductor is an n-type semiconductor. Examples of n-type semiconductors include fullerenes, benzobisimidazobenzophenanthrolines, indenofluorenes, bisindenofluorenes, dithenodiimides, rylene-dicarboximides, dithienopyrroles, dialkylperylenedicarboximide-dithiophenes, dialkylnaphthalenedicarboximide-dithiophenes, cyanovinylenephenylenes, dicyanophenylenevinylenes, benzothiadiazoles, quinoxalines, thienoimide (thienopyrrole-dione), diketopyrrolopyrroles, and derivatives thereof.

The transport of electrons and holes, the so-called ambipolar charge transport, in field-effect transistors is a highly desirable property. The use of ambipolar materials enables the fabrication of complementary-like circuits through the use of a single semiconductor that functions both as p- and/or as n-channel, hence significantly reducing fabrication complexity. Furthermore, the advantages compared with unipolar logic are low power dissipation, higher operating frequencies, a good noise margin, and robust operation.

According to an embodiment, the semiconductor is an ambipolar-type semiconductor. Examples of ambipolar-type semiconductors include dialkylfluorene-alt-benzothiadiazoles, metal phthalocyanines, nickel-dithiolenes, squaraines, selenophenes, alkylterselenophenes, naphthalene-biscarboximide-bithiophenes, diketopyrrolopyrroles, dithienopyrroles, dithienopyrrole-benzobisthiadiazoles, and derivatives thereof.

The thickness of the organic semiconductor layer is preferably larger than a monolayer (>0.5 nm). The thickness of the semiconductor layer may preferably be in the range of 1-100 nm, such as about 30 nm. It is mainly the part of the semiconductor closest to the electrolyte that is affected by the applied gate potential. Increasing the semiconductor layer thickness will enlarge the current between source and drain when the transistor is turned off, and thus reduce the on/off current ratio of the transistor.

The ferroelectric layer of the ferroelectric field-effect transistor device may comprise an organic, inorganic or organic-inorganic ferroelectric material. The ferroelectric layer may consist of a single ferroelectric material or a mixture of two or more ferroelectric materials. Optionally, the ferroelectric layer may further comprise non-ferroelectric additives, for example a non-ferroelectric dielectric.

Examples of inorganic ferroelectric materials, which could be employed in the ferroelectric layer include, but are not limited to antimony sulfoiodide, barium titanate, colemanite, europium barium titanate, germanium telluride, lead scandium tantalate, lead titanate, lead zirconate titanate, lithium niobate, potassium dihydrogen phosphate, potassium titanyl phosphate, and sodium nitrite.

According to an embodiment, the ferroelectric material of the ferroelectric field-effect transistor device is an organic ferroelectric material. Organic ferroelectric materials may comprise molecular, macromolecular, oligomeric or polymeric ferroelectric materials.

Examples of organic ferroelectric materials, which could be employed in the ferroelectric layer include, but are not limited to ferroelectric polymers, potassium sodium tartrate, benzimidazoles, thiourea, TEMPO (2,2,6,6-tetramethyl-1-piperidinyloxy), CDA (cyclohexan-1,1'-diacetic acid), TCAA (trichloroacetamide), Benzil, DNP (1,6-bis(2,4-dinitrophenoxy)-2,4-hexadiyne), TCHM (tricyclohexylmethanol), VDF oligomer, CT complexes such as TTF-CA and TTF-BA, Phz-$H_2$ca, Phz-$H_2$ba, [H-55dmbp][Hia], and β-quinol-methanol clathrate.

Ferroelectric polymers that may be used in the invention include, but are not limited to, polyvinylidene fluoride (PVDF) and its copolymers with trifluoroethylene (P(VDF-TrFE)), terpolymers based on either copolymers or P(VDF-TrFE), other ferroelectric polymers such as odd-numbered nylons, such as nylon-11 or cyanopolymers.

Examples of organic-inorganic ferroelectric compounds that may be used in the invention include, but are not limited to, HdabcoReO$_4$ (dabco=diazabicyclo[2.2.2]octane), TGS (triglycine sulphate), TSCC (Tris-sarcosine calcium chloride) and Rochelle salt.

According to an embodiment, the ferroelectric layer consists of a P(VDF-TrFE) copolymer. In addition to having good ferroelectric properties, these polymers also have excellent dielectric properties. The ratio of VDF to TrFE monomer in the P(VDF-TrFE) copolymer may be in the range of 90/10 to 10/90, preferably in the range of 90/10 to 50/50, or more preferably in the range of 80/20 to 60/40, such as about 75/25, 70/30 or 65/35.

The thickness of the ferroelectric layer is preferably larger than 10 nm. The thickness of the ferroelectric layer may for example be in the range of 10-1000 nm. The thickness of the ferroelectric layer may typically be in the range of 20-400 nm, such as in the range of 60-200 nm, such as about 140 nm. The thickness of the ferroelectric layer may preferably be kept low, e.g. below 200 nm since thicker layers may require higher switching (polarization) voltages. A thickness above 60 nm may be preferred, since lower thickness may lead to unstable performance in terms of remanent polarization characteristics, but ferroelectric layers having a thickness of less than 60 nm may also be acceptable depending on the device structure. For example, in a device comprising a polymeric interlayer between the ferroelectric layer and the gate electrode, the thickness of the ferroelectric layer may be less than 60 nm.

According to an embodiment, the semiconductor, the ferroelectric and/or the ion conductor comprise organic materials. According to a preferred embodiment, the semiconductor, the ferroelectric and the ion conductor all comprise organic materials. One advantage of using organic materials in the ferroelectric field-effect transistor device is that it may allow of manufacturing flexible electronic devices. A further advantage of using organic materials in the device is that such organic materials are generally suitable for being applied to a substrate using liquid deposition techniques. Preferably, at least one of the semiconductor, the ferroelectric and/or the ion conductor may be applied by liquid deposition techniques. According to an embodiment, the semiconductor, the ferroelectric and/or the ion conductor can be applied by liquid deposition techniques. According to a preferred embodiment, the semiconductor, the ferroelectric and the ion conductor can all be applied by liquid deposition techniques.

According to a more specific embodiment, the semiconductor is selected from the group consisting of semiconducting polymers, the ferroelectric is selected from the group consisting of ferroelectric polymers, and the ion conductor is selected from the group consisting of polymeric electrolytes.

In the transistor channel of the ferroelectric field-effect transistor device ions collected at the ion conductor-semiconductor interface attract compensation charges in the semiconductor by means of field-effect, so that an electric double layer is formed at the interface, and the channel opens when enough charge carriers in the organic semiconductor are accumulated at said interface. Preferably, there is no significant motion or transport of ions between the ion conductor and the transistor channel, i.e. the organic semiconductor. Hence, electrochemistry is prevented or at least substantially restricted from occurring in the organic semiconductor.

One way of minimizing the penetration of charge carriers from the ion conductor into an organic, for example polymeric, semiconductor is to select or arrange the ion conductor such that it dissociates into smaller and substantially larger ion-complexes of opposite charge, and selecting the voltage applied to the gate electrode such that the smaller ion-complexes are attracted to the gate electrode. The large ion-complexes preferably comprise long polymer chains or large molecules. The size of the larger ion-complexes either prevents them from penetrating into the organic semiconductor, and/or renders them substantially immobile, such that they do not migrate to the interface between said ion conductor and said organic semiconductor to any significant extent. This effect is also achieved when the voltage applied to the gate electrode is not sufficiently high to effectuate any substantial displacement of the larger ion-complexes. In other words, the mobility of an ion is a combination of their size and the applied electric field.

Accordingly, when the semiconductor layer comprises a p-type semiconductor, the ion conductor is preferably selected from the group consisting of electrolytes composed of larger anionic molecules and smaller cationic molecules, such as polyanions or polymeric anions with proton or metal counter ions.

When the semiconductor layer comprises an n-type semiconductor, the ion conductor is preferably selected from the group consisting of electrolytes composed of larger cationic molecules and smaller anionic molecules, such as polycations or polymeric cations with smaller negatively charged counter ions.

The ferroelectric field-effect transistor device preferably comprises at least three electrodes, a source electrode arranged in electronic contact with the said semiconductor, a drain electrode arranged in electronic contact with the said semiconductor, and a gate electrode arranged for tuning the conductivity of the semiconductor.

As used herein, the expression that two materials are 'electronic contact' means that an exchange of electrons is enabled between the two materials. The semiconductor layer, or a portion thereof, forms the transistor channel, through which electrons can travel between the source and drain electrodes when the semiconductor is in a conductive state. Hence, in the context of this disclosure it also means that if the organic semiconductor material is in a conducting state, and a voltage is applied to said source electrode and said drain electrode, a current will flow through said semiconductor material, across the transistor channel, from said source to said drain electrode.

Generally, it is not necessary that the gate electrode is arranged such that it faces said source and drain electrodes. In other words, the gate electrode may be laterally displaced along the surface of said electrolyte layer, with respect to said source and drain electrodes.

Said source, drain and gate electrodes are preferably each arranged of a different material compared to said organic semiconductor. The electrodes may generally consist of materials having high electrical conductivity.

Advantageously, said source electrode and/or said drain electrode and/or said gate electrode comprises a material selected from the group consisting of chromium, titanium, copper, aluminium, molybdenum, tungsten, nickel, gold, palladium, platinum, conducting polymers and oligomers, carbon paste, carbon nanotubes, silver paste and combination thereof. In applications where a fully organic device is desired, e.g. to facilitate disposal/recycling, the electrodes may consist of conducting polymers and oligomers.

Preferably, the thickness of the said source and drain electrodes is in the range 30 nm to 500 nm.

Figure 2:
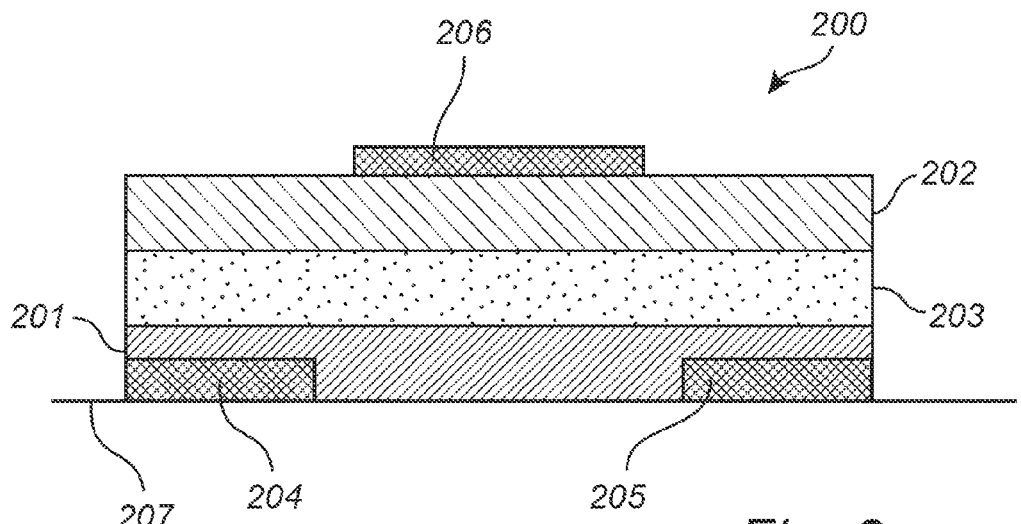
FIG. 2 schematically illustrates a cross-section of a transistor according to the invention in top gate configuration.

FIG. 2 schematically shows one embodiment of a ferroelectric field-effect transistor 200 according to the invention. The ferroelectric field-effect transistor device of FIG. 2 is arranged in a so called top gate configuration. The transistor 200 is arranged on a substrate 207. The transistor 200 comprises a source electrode 204 and a drain electrode 205, which are both in electronic contact with a semiconductor layer 201. The semiconductor layer 201 is arranged such that its conducting properties can be varied, e.g. by altering its polarization. Hence, when a voltage is applied between the source electrode 204 and the drain electrode 205, the size of the current through the transistor channel, between said source and drain electrodes 204, 205 can be controlled by controlling the polarization of the semiconductor layer 201.

A ferroelectric layer 202 is arranged between said semiconductor layer 201 and a gate electrode 206. The ferroelectric layer 202 is arranged such that polarization of the ferroelectric material can be altered by changing the voltage applied to the gate electrode 206.

The transistor 200 further comprises an ion conductor layer 203 arranged between said semiconductor layer 201 and said ferroelectric layer 202.

The conductivity of the transistor channel is altered or controlled by changing the electric field created at the ion conductor-semiconductor interface. This altered electric field may be achieved by changing the voltage applied to the gate electrode 206, whereby ferroelectric polarization of the ferroelectric layer 202 is achieved. The polarization of the ferroelectric layer 202 in turn causes the ion in the ion conductor layer 203 to be redistributed. Ions collected at the ion conductor-semiconductor interface attract compensation charges in the semiconductor by means of field-effect, so that an electric double layer is formed at the interface, and the channel opens when enough charge carriers in the semiconductor are accumulated at said interface. The active section of the transistor channel is normally defined by the extension of the electric double layer in the semiconductor, which usually is in the order of a few nanometers. In other words, when a suitable voltage is applied to the gate electrode 206, ions are redistributed in the ion conductor layer 203, such that an electric field is created, which alters the polarization of the semiconductor layer 201.

Ideally, the current between said source and drain electrodes 204,205 is zero when there is no electric field applied across said ion conductor. Moreover, ideally there is no electronic contact, i.e. no leakage current, between said gate electrode 206 and any of said source or drain electrodes 204,205.

Although a random copolymer of vinylphosphonic acid and acrylic acid, labelled P(VPA-AA) for the sake of simplicity, is used in many of the below described embodiments, the man skilled in the art will from the information given in this document be able to make any necessary adjustments in order to use the other substances described herein instead of P(VPA-AA). The manufacturing process is identical up to and including the semiconductor layer in all the below described embodiments.

When applying gate electrode 206 to a transistor as shown in FIG. 2, there is a danger of damaging the ferroelectric layer 202. To reduce the risk of damaging the ferroelectric layer a polymeric interlayer may be applied between the ferroelectric layer and the gate electrode. This allows a wider selection of electrode deposition and patterning processes and electrode materials. A polymeric interlayer can also prevent diffusion of metal from a metal gate electrode into the ferroelectric layer, thereby reducing the leakage current, and improve the printability when an aqueous-based polymeric electrode is applied.

Figure 3:
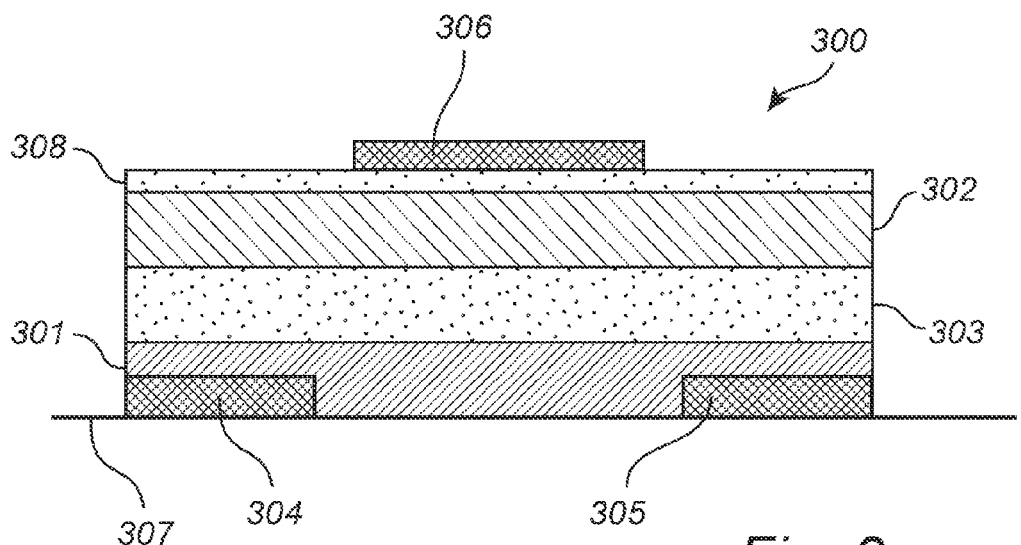
FIG. 3 schematically illustrates a cross-section of a transistor according to the invention in top gate configuration.

FIG. 3 schematically shows one embodiment of a ferroelectric field-effect transistor 300. The transistor of FIG. 3 corresponds to the transistor of FIG. 2, further comprising a polymeric interlayer 308 arranged between said gate electrode and said ferroelectric layer. The polymer of the polymeric interlayer 308, which may for example comprise a polyelectrolyte, protects the thin ferroelectric layer from damage when the gate electrode is applied and may also provide improved adhesion between the ferroelectric layer and the gate electrode.

The material of polymeric interlayer 308 may be selected among the same materials as the ion conductor layer. According to an embodiment, the materials of polymeric interlayer and the ion conductor layer are the same.

Typically the polymeric interlayer comprises a polyelectrolyte. The polymeric interlayer may for example consist of a homopolymer or copolymer bearing phosphonic or phosphoric acid groups and optional other functional groups, or a blend thereof. An example of a polymeric interlayer material useful in a ferroelectric field-effect transistor according to the invention is a co-polymer of vinylphosphonic acid (VPA) and acrylic acid (AA), such as co-polymer P(VPA-co-AA)(70:30). Such materials display low complex impedance, even under anhydrous conditions and at higher temperatures, e.g. at 80° C. It also exhibits high dielectric constants (300-500) in the frequency range 10 kHz to 100 kHz.

The thickness of the polymeric interlayer may for example be in the range of 1-1000 nm. The thickness of the polymeric interlayer is preferably larger than 10 nm. The thickness of the polymeric interlayer may typically be in the range of 20-200 nm, such as in the range of 40-100 nm or in the range of 40-80 nm.

Figure 4:
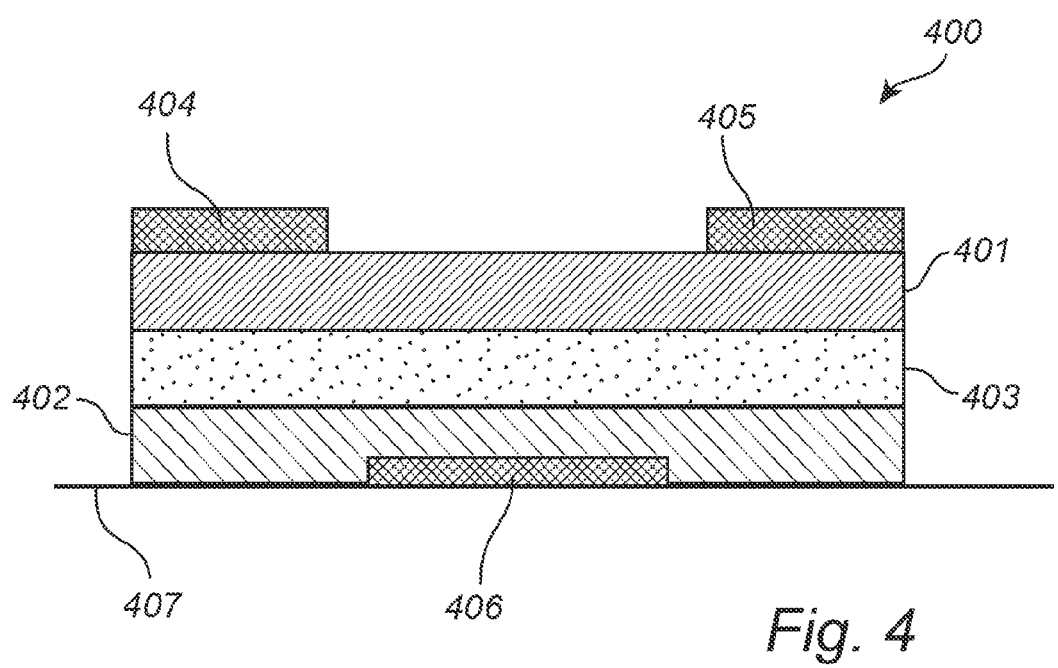
FIG. 4 schematically illustrates a cross-section of a transistor according to the invention in bottom gate configuration.

FIG. 4 schematically shows one embodiment of a ferroelectric field-effect transistor 400 according to the invention. The ferroelectric field-effect transistor device of FIG. 4 is arranged in a so called bottom gate configuration. The transistor comprises a gate electrode 406 arranged on a substrate 407. A ferroelectric layer 402 is applied over the gate electrode 406 such that the polarization of the ferroelectric material can be altered by changing the voltage applied to the gate electrode 406. An ion conductor layer 403 is applied over the ferroelectric layer 402 such that the ion conductor layer is separated from the gate electrode by the ferroelectric layer. A semiconductor layer 401 is applied over the ferroelectric layer 402 such that the semiconductor layer is separated from the gate electrode by the ion conductor layer and the ferroelectric layer. The transistor 400 comprises a source electrode 404 and a drain electrode 405, which are both in electronic contact with the semiconductor layer 401. The semiconductor layer is arranged such that its conducting properties can be varied, e.g. by altering its polarization. Hence, when a voltage is applied between the source electrode 404 and the drain electrode 405, the size of the current through the transistor channel, between said source and drain electrodes 404,405 can be controlled by controlling the polarization of the semiconductor layer 401.

According to an embodiment (not shown) the transistor 400 of FIG. 4 may further comprise a polymeric interlayer arranged between the gate electrode 406 and the ferroelectric layer 402. The material and thickness of such polymeric interlayer would correspond to the materials and thickness described above with reference to the polymeric interlayer 308 of FIG. 3. Having a polymeric interlayer in the transistor 400 can smooth the metal surface and improve the metal/ferroelectric interface.

Figure 5:
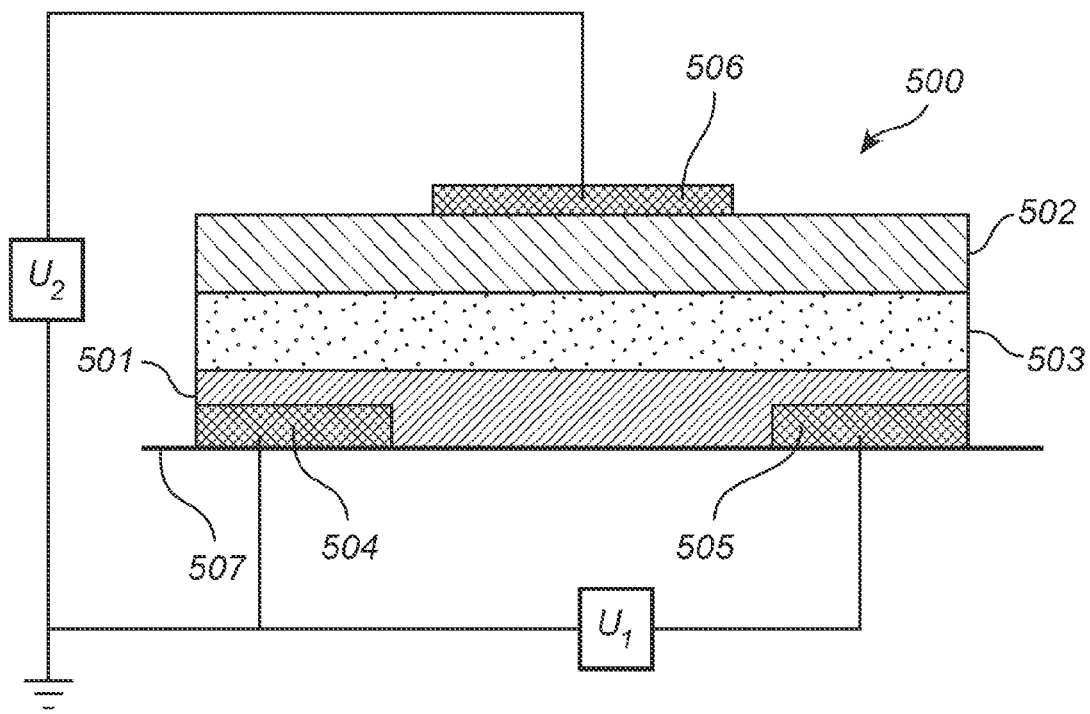
FIG. 5 schematically illustrates a cross-section of a transistor according to the invention in top gate configuration.

FIG. 5 schematically illustrates a transistor circuit 500 which will be used to further illustrate the operation and properties of the ferroelectric field-effect transistor according to the invention.

Figure 6A:
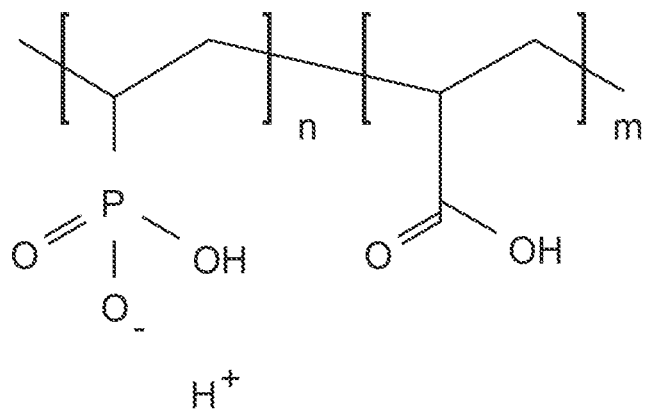
FIG. 6 schematically illustrates the chemical structures of P(VPA-AA) (FIG. 6a) and P(VDF-TrFE) (FIG. 6b).
Figure 6B:
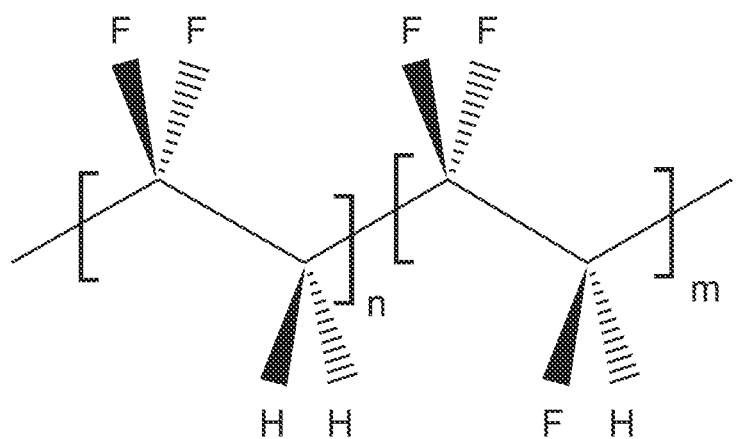

The transistor of FIG. 5 comprises a source electrode 504 and a drain electrode 505 (both 3-nm-thick Ti and 27-nm-thick Au) applied to a glass substrate 507 by photolithography and wet etching procedure. The source and drain electrodes 504,505 are both in electronic contact with a semiconductor layer 501 consisting of regioregular poly(3-hexylthiophene) (P3HT) applied to the substrate by spin-coating to a film thickness of 30 nm. The semiconductor layer 501 is arranged such that its conducting properties can be varied, e.g. by altering its polarization. Hence, when a voltage $U_1$ is applied between the source electrode 504 and the drain electrode 505, the size of the current through the transistor channel, between said source and drain electrodes 504,505 can be controlled by controlling the polarization of the semiconductor layer 501. An ion conductor layer 503 consisting of poly(vinylphosphonic acid-co-acrylic acid) (P(VPA-AA), FIG. 6a) is applied to the semiconductor layer by spin-coating to a film thickness of about 130 nm. A ferroelectric layer 502 consisting of ferroelectric poly(vinylidene-fluoride-co-trifluorethylene) (P(VDF-TrFE), FIG. 6b) 70/30 mol % copolymer is applied to the ion conductor layer 503 by spin-coating to a film thickness of about 140 nm. A gate electrode 506 formed by thermal evaporation of metals to a thickness of 80 nm is arranged on top of the ferroelectric layer 502 and separated from the semiconductor layer 501 by the ferroelectric and ion conductor layers 502,503. The ferroelectric layer 502 is arranged such that polarization of the ferroelectric material can be altered by changing the voltage applied to the gate electrode.

For a p-channel transistor device as illustrated in FIG. 5, by applying a negative "writing" gate voltage $U_2$, the ferroelectric layer gets fully polarized and a negative charge spatial distribution at ferroelectric/ion conductor interface is established. The cations in the ion conductor layer are disassociated and migrate to ferroelectric layer along the "writing" electric field. The charge spatial distribution at the ion conductor/semiconductor interface is changed; an electrical double layer is established and conductivity in the transistor channel is subsequently increased. The device is then in "on" state. The "on" state can be kept even if the "writing" voltage is removed since the ferroelectric layer is fully polarized and prevent the cations returning to their original sites in neutral state. Oppositely, by applying a positive "erasing" gate voltage $U_2$, the ferroelectric layer depolarizes and the cations at ferroelectric/ion conductor interface are pushed back returning to their original sites in neutral state. In that case, the electrical double layer at the ion conductor/semiconductor interface is weakened and the conducting channel between the drain and source electrode is turned off.

The applied voltages should be chosen carefully. Too high voltages could produce mobile ions having such polarity that they could migrate into the semiconductor layer when a gate voltage is applied. Typically, gate control voltage or the voltage difference between said source and gate electrode is between −20 V to +20 V, preferably between −10 V to +10 V. The required voltage depends for example on the thickness of the ferroelectric layer.

The operation and properties of an embodiment of the ferroelectric field-effect transistor as described with reference to FIG. 5 will be further illustrated by the examples. In the above embodiments, the inventors have shown that an ion conductor can be used for significantly improving the properties of a ferroelectric field-effect transistor. Such a transistor has clear applications in non-volatile memory devices, as well as in large transistor-to-transistor logic networks, radio-frequency identification technologies and matrixed organic light-emitting diode displays. Employing an ion conductor layer also eases design and manufacturing requirements. Patterning critical dimensions and depositing a thin gate insulator become unnecessary since a nanometer-scale "capacitor" spontaneously forms as the gate is biased. Simple architectures with all three terminals on the same substrate are possible, in principle. The resulting flexibility makes printing (as well as other inexpensive manufacturing techniques) a viable manufacturing platform.

Some of the advantages of a ferroelectric field-effect transistor device include:
1) Electrical addressing and reprogramming
2) Multi-bit storage per memory cell
3) Short program/erase times (<0.2 ms)
4) Endurance to repeated program/erase cycles
5) Non-volatility of years (>5 years)
6) Low-voltage operation (<10 V) and low-voltage non-destructive read-out (0.2-1V)
7) High-temperature stability (>80° C.)
8) Printability on flexible substrates.

While the invention has been described with reference to various exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Particularly, a person skilled in the art will in the light of the present disclosure be able to select suitable electrode materials, semiconductor materials, ferroelectric materials and ion conductor materials. He also realizes that the shape of the electrodes can be modified such as to provide a stronger electric field across the ion conductor, or an additional electrode, besides the source and drain electrodes, can be arranged on the opposite side of said organic semiconductor material compared to said gate electrolyte, which additional electrode is not in electronic contact with said organic semi conducting layer. Further, a man skilled in the art understands that the transistor device can be manufactured by e.g. screen printing, flexo printing, ink-jet printing, gravure printing, offset printing, spin coating, evaporation, chemical vapor deposition, electrodeposition, and electroless plating.

EXAMPLE

A ferroelectric field-effect transistor as generally described above with reference to FIG. 5 was prepared. Ferroelectric poly(vinylidene-fluoride-co-trifluorethylene) (P(VDF-TrFE)) 70/30 mol % copolymer (Solvay SA) was dissolved in diethyl carbonate (DEC) at a concentration of 4% w/v and filtered through a 0.1 μm filter. Poly(vinylphosphonic acid-co-acrylic acid) (P(VPA-AA)) (Rhodia) was dissolved in a 4:1 mixture of 1-propanol and deionized water at a concentration of 4% w/v and filtered through a 0.2 μm nylon syringe filter. Regioregular poly(3-hexylthiophene) (P3HT) (Sigma-Aldrich) was dissolved in 1,2-dichlorobenzene at a concentration of 1% w/v and filtered through a 0.2 μm polytetrafluoroethylene (PTFE) syringe filter. Thin films were prepared by spin-coating in a class 1,000 clean room environment.

Corning glass substrates were cleaned sequentially in deionized water, acetone and isopropanol. Interdigitated source and drain electrode (3-nm-thick Ti and 27-nm-thick Au) were defined by photolithography and wet etching procedure. The substrates were cleaned carefully again using deionized water, acetone and isopropanol before use. The semiconductor layer was formed by spin-coating the solution at 2000 rpm for 30 s giving a film thickness of 30 nm. The films were then annealed at 120° C. for 30 min under nitrogen. The polyelectrolyte solution was spin-coated at 2000 rpm for 60 s and dried on a hot plate under vacuum at 120° C. for 120 s, resulting in a thickness of about 130 nm. The P(VDF-TrFE) layer was subsequently spin-coated on top of the polyelectrolyte layer and annealed at 135° C. for 1 h in vacuum oven in order to increase the film crystallinity. The film thickness was controlled by varying the spin speed, measured by ellipsometry and confirmed by using a DekTak profilometer. An 80-nm-thick top electrode for the transistor was formed by thermal evaporation of various metals through a Ni shadow mask (Tecan Ltd.).

The electrical characteristics of the ferroelectric transistors were measured using a semiconductor parameter analyzer (Keithley 4200-SCS). The impedance measurements were carried out with an Alpha high-resolution dielectric analyzer (Novocontrol GmbH). An AC voltage of 0.3 V was applied, the frequency was set at 1 kHz, and the DC voltage was swept from positive to negative voltages. An equivalent circuit model made of a resistor and a capacitor in parallel was used to extract the effective capacitance, which was calculated from the equation $C=1(2\pi f Im(Z))$ and where f is the frequency and Z is the measured impedance.

Figure 7A:
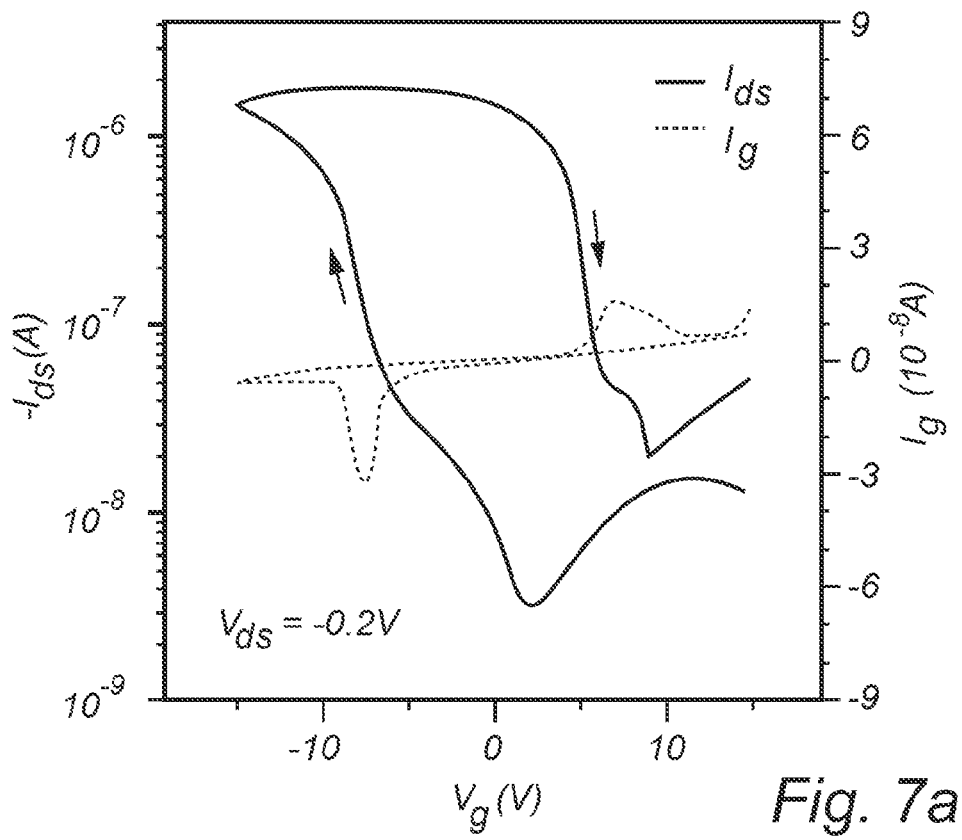
FIGS. 7a and 7b are diagrams illustrating the properties of a transistor as described in relation to FIG. 5.
Figure 7B:
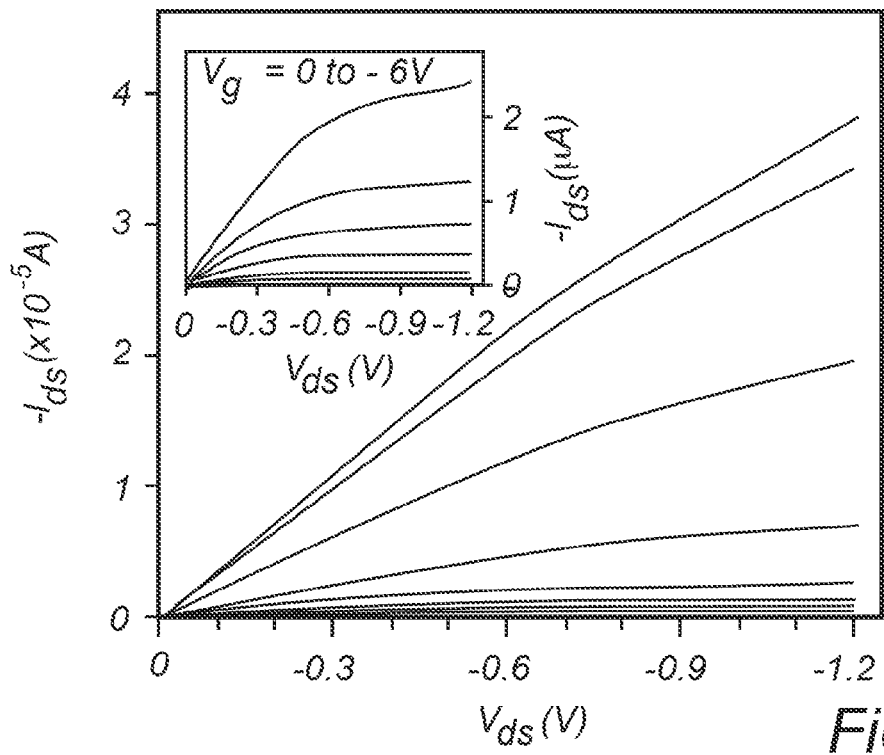

FIG. 7a-b shows the current-voltage characteristics of the ferroelectric field-effect transistor device. The transistor works in the accumulation enhancement mode where holes are the majority charge carriers. Typical transfer characteristic ($I_{ds}$ vs. $V_g$), recorded in the linear regime at very low source-drain bias ($V_{ds}$=−0.2 V), is reported in FIG. 7a. The ferroelectric field-effect transistor device shows a clockwise hysteresis of the drain current consistent with the accumulation and depletion of p-type charge carriers. This is consistent with the current retention behavior due to the dipolar polarization of the ferroelectric layer. In fact, when the polarization switches from one state to another, charges are displaced across the ferroelectric insulator film.

The accompanying switching currents are observed as sharp features in gate current and as steep increase/decrease of the drain current. Their presence supports and confirms that the memory effect is driven by ferroelectric polarization switching, rather than charge trapping mechanisms or ion migration in and through the ferroelectric layer. Hence, the transistor behaves as a bi-stable memory cell element; before the very first sweep, the ferroelectric film is unpolarized. Upon increasing the negative gate bias beyond the coercive field ($E_c$=53 MV m$^{-1}$ for the 140-nm-thick P(VDF-TrFE)) the ferroelectric film becomes fully polarized and an electrical double layer is quickly formed along the ferroelectric-polyelectrolyte interface. At the same time an elevated hole density is established at the semiconductor-polyelectrolyte interface and a high drain current is measured already at $V_{dsb}$=−0.2 V. Upon scanning back the gate voltage, towards and beyond zero, the ferroelectric remains polarized and the current remains high in the on-state. At a positive gate voltage bias of around +7 V, the coercive field is reached and the sign of the ferroelectric polarization changes. The accumulation of electrons along the semiconductor-polyelectrolyte interface, i.e. in the transistor channel, is then severely hampered by the large energy barrier for electron injection from the gold contact into the P3HT conduction band. The output characteristic, $I_{ds}(V_{ds})$, is shown in FIG. 7b. We note that, at high drain bias voltages where the saturated $I_{ds}$ is proportional to the square of the gate drive, two distinct slopes are visible for $I_{ds}$ vs. $V_g^2$ with a typical crossover point at around −7 V. This is consistent with an increased carrier density distribution in the channel region after ferroelectric polarization. The field-effect mobility in the linear regime, $\mu_{lin}$, has been calculated according to the expression: $\mu_{lin}$=(LW$^{-1}$C$_i^{-1}$V$^{-1}$)(dI$_{ds}$/dV$_g$). The mobility reaches 0.1 cm$^2$ V$^{-1}$ s$^{-1}$. The current levels in the off-state and on-state (the on/off ratio at zero $V_g$) differ by nearly 3 orders of magnitude. Due to the relatively high coercive field of P(VDF-TrFE) ($E_C$~50 MV m$^{-1}$) the $V_g$ necessary to switch the devices is rather high (see FIG. 7). Low-voltage switching ferroelectric field-effect transistor devices can be attained by reducing the ferroelectric layer thickness well below 100 nm. Indeed, shrinking the P(VDF-TrFE) layer thickness down to 60 nm results in a lower operating bias for switching ($V_C$<3 V). However, we find that such a narrow voltage window leads to unstable performance in terms of remanent polarization characteristics. The primary mechanism of retention loss can be ascribed to a depolarization of the ferroelectric thin film. Indeed, the depolarization field in P(VDF-TrFE) can be more likely caused by the field-effect band bending in the semiconductor and the magnitude of this effect scales conversely with the thickness of the ferroelectric layer.

Figure 8:
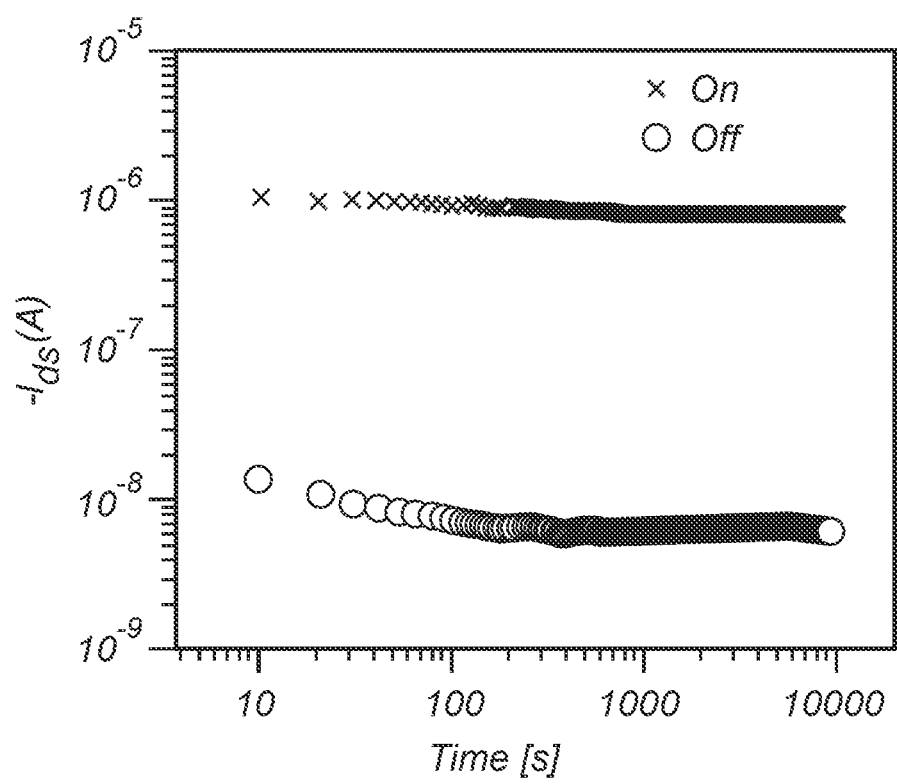
FIG. 8 is a diagram illustrating the properties of a transistor as described in relation to FIG. 5.

Data retention characteristics of the devices were examined by measuring the remnant drain current level as a function of time. Long retention time is typical for ferroelectric capacitors and field-effect transistors. FIG. 8 shows the value of drain current in the on- and off-states as a function of the retention time, measured at $V_{ds}$=−0.2 V. The on- and off-states were programmed by poling the ferroelectric at gate voltages of −15 and +15 V with a 3 s pulse, respectively. The memory retention is found to be rather excellent for these ferroelectric field-effect transistor devices with the on/off ratio being more than two orders of magnitude even after 10,000 s.

The invention claimed is:

1. A ferroelectric field-effect transistor device, comprising:
a semiconductor layer;
a ferroelectric layer; and
an ion conductor layer arranged between said semiconductor layer and said ferroelectric layer and in contact with the semiconductor layer.

2. The device of claim 1, further comprising:
a source electrode arranged in electronic contact with the said semiconductor;
a drain electrode arranged in electronic contact with the said semiconductor; and
a gate electrode;
said ferroelectric layer being arranged between said gate electrode and said ion conductor layer.

3. The device of claim 1, wherein at least one of the semiconductor, the ferroelectric and the ion conductor comprise organic materials.

4. The device of claim 1, wherein at least one of the semiconductor, the ferroelectric and the ion conductor is appliable by liquid deposition techniques.

5. The device of claim 1, wherein the semiconductor is selected from the group consisting of semiconducting polymers.

6. The device of claim 1, wherein the ferroelectric is selected from the group consisting of ferroelectric polymers.

7. The device of claim 1, wherein the ion conductor is selected from the group consisting of polymeric electrolytes.

8. The device of claim 2, further comprising a polymeric interlayer, said interlayer being arranged between said gate electrode and said ferroelectric layer.

9. The device of claim 1, arranged on a substrate.

10. A non-volatile memory device comprising the ferroelectric field-effect transistor device of claim 1.

11. Method of producing a ferroelectric field-effect transistor device, comprising:
providing a substrate;
applying a semiconductor layer;
applying a ferroelectric layer; and
applying an ion conductor layer;
wherein said ion conductor layer is arranged between said semiconductor layer and said ferroelectric layer and in contact with the semiconductor layer.

12. The method according to claim 11, further comprising:
applying a source electrode to the substrate;
applying a drain electrode to the substrate;
applying the semiconductor layer in electronic contact with said source and drain electrodes;
applying the ion conductor layer to the semiconductor layer;
applying the ferroelectric layer to the ion conductor layer; and
applying a gate electrode to the ferroelectric layer.

13. The method according to claim 11, further comprising:
applying a gate electrode to the substrate;
applying the ferroelectric layer to the gate electrode;
applying the ion conductor layer to the ferroelectric layer;
applying the semiconductor layer to the ion conductor layer;
applying a source electrode in electronic contact with the said semiconductor; and
applying a drain electrode in electronic contact with the said semiconductor.

14. The method of claim 12, further comprising applying a polymeric interlayer between said gate electrode and said ferroelectric layer.

15. The method of claim 11, wherein the semiconductor layer, the ferroelectric layer and the ion conductor layer are applied by liquid deposition techniques.

16. The method of claim 11, wherein said substrate is a solid substrate.

17. A method, comprising:
outputting, using an ion conductor layer between a ferroelectric layer and a semiconductor layer of a ferroelectric field-effect transistor device, readout voltage of a non-volatile memory device including the ferroelectric field-effect transistor device to a voltage as low as 0.2 V.

18. The device of claim 9, wherein the substrate is a flexible solid substrate.

19. A non-volatile memory device comprising the ferroelectric field-effect transistor device of claim 2.

20. The method of claim 16, wherein the solid substrate is a flexible solid substrate.

* * * * *